United States Patent
Chen et al.

(10) Patent No.: US 9,824,728 B2
(45) Date of Patent: Nov. 21, 2017

(54) METHOD FOR PERFORMING MEMORY INTERFACE CALIBRATION IN AN ELECTRONIC DEVICE, AND ASSOCIATED APPARATUS AND ASSOCIATED MEMORY CONTROLLER

(71) Applicant: MEDIATEK INC., Hsin-Chu (TW)

(72) Inventors: Shang-Pin Chen, Hsinchu County (TW); Bo-Wei Hsieh, Tainan (TW)

(73) Assignee: MediaTek Inc., Hsin-Chu (TW)

( * ) Notice: Subject to any disclaimer, the term of this patent is extended or adjusted under 35 U.S.C. 154(b) by 208 days.

(21) Appl. No.: 14/294,094

(22) Filed: Jun. 2, 2014

(65) Prior Publication Data
US 2015/0170719 A1    Jun. 18, 2015

Related U.S. Application Data

(60) Provisional application No. 61/916,770, filed on Dec. 16, 2013.

(51) Int. Cl.
| | |
|---|---|
| H03K 17/16 | (2006.01) |
| G11C 7/10 | (2006.01) |
| G11C 29/02 | (2006.01) |
| G11C 5/06 | (2006.01) |
| H03K 19/0185 | (2006.01) |

(Continued)

(52) U.S. Cl.
CPC .......... G11C 7/109 (2013.01); G06F 13/1689 (2013.01); G11C 5/063 (2013.01); G11C 29/022 (2013.01); G11C 29/028 (2013.01); H03K 19/018557 (2013.01); H04L 25/0278 (2013.01);

(Continued)

(58) Field of Classification Search
CPC ............. G06F 13/1694; G06F 13/1657; G06F 13/4243; G06F 13/1689; G11C 5/147; G11C 2207/2254; G11C 7/109; G11C 5/063; G11C 29/022; G11C 29/028;

(Continued)

(56) References Cited

U.S. PATENT DOCUMENTS

| | | | |
|---|---|---|---|
| 2007/0073506 A1* | 3/2007 | Boskovic ............... | G01R 31/30 702/107 |
| 2007/0236247 A1* | 10/2007 | Wang .................... | G11C 7/1048 326/30 |

(Continued)

FOREIGN PATENT DOCUMENTS

CN    101350216 A    1/2009

*Primary Examiner* — Hong Kim
(74) *Attorney, Agent, or Firm* — Wolf, Greenfield & Sacks, P.C.

(57) ABSTRACT

A method for performing memory interface calibration in an electronic device, an associated apparatus, and an associated memory controller are provided, where the method includes: controlling a signal on a digital terminal of the memory controller to switch between a plurality of levels, wherein the digital terminal is coupled to a memory of the electronic device; and based on at least one detection result obtained from detecting the signal, calibrating a logical state of the signal to correspond to a level of the plurality of levels. More particularly, the memory controller may include a plurality of command terminals, a plurality of data terminals, and at least one clock terminal, which are used for coupling the memory controller to the memory. For example, the digital terminal may be a command terminal or a data terminal.

20 Claims, 10 Drawing Sheets

(51) Int. Cl.
*H04L 25/02* (2006.01)
*G06F 13/16* (2006.01)

(52) U.S. Cl.
CPC ........ *H04L 25/0298* (2013.01); *G11C 7/1057* (2013.01); *G11C 7/1084* (2013.01)

(58) Field of Classification Search
CPC ............... G11C 7/1057; G11C 7/1084; H03K 19/018557; H04L 25/0298; H04L 25/0278
USPC ............... 326/21, 30, 31; 702/107; 710/104; 365/189.06, 189.07, 189.09, 189.11
See application file for complete search history.

(56) References Cited

U.S. PATENT DOCUMENTS

| | | | |
|---|---|---|---|
| 2008/0215905 A1* | 9/2008 | Mueller | G06F 13/1694 713/400 |
| 2009/0003112 A1* | 1/2009 | Zumkehr | G11C 5/147 365/226 |
| 2010/0188918 A1* | 7/2010 | Fox | G06F 13/4086 365/226 |
| 2012/0204054 A1* | 8/2012 | Zerbe | G06F 1/10 713/400 |
| 2013/0227183 A1* | 8/2013 | Shaeffer | G06F 13/1684 710/104 |
| 2014/0149654 A1* | 5/2014 | Venkatesan | G11C 5/147 711/106 |
| 2014/0181331 A1* | 6/2014 | Ware | G06F 13/1694 710/14 |
| 2014/0233322 A1* | 8/2014 | Wu | G11C 16/3404 365/185.24 |

* cited by examiner

METHOD FOR PERFORMING MEMORY INTERFACE CALIBRATION IN AN ELECTRONIC DEVICE, AND ASSOCIATED APPARATUS AND ASSOCIATED MEMORY CONTROLLER

CROSS REFERENCE TO RELATED APPLICATIONS

This application claims the benefit of U.S. Provisional Application No. 61/916,770, which was filed on Dec. 16, 2013, and is included herein by reference.

BACKGROUND

The present invention relates to memory interface control in an electronic device, and more particularly, to a method for performing memory interface calibration in an electronic device, and an associated apparatus and an associated memory controller.

A conventional portable electronic device such as a conventional multifunctional mobile phone is typically equipped with one or more memories, and a conventional memory controller may be used for controlling a specific memory in the conventional portable electronic device. According to the related art, the architecture of the conventional memory controller typically depends on the characteristics of the specific memory, and therefore, some problems may occur. For example, in a design phase of developing the conventional portable electronic device, the hardware designer of the conventional portable electronic device may need to select a memory component that is provided by a first memory vendor as the specific memory in a first situation (e.g. for a specific version of the conventional portable electronic device). In a later phase of developing the conventional portable electronic device, the hardware designer of the conventional portable electronic device may need to select another memory component that is provided by another memory vendor in a second situation (e.g. for a revised version of the conventional portable electronic device). As a result, the hardware designer of the conventional portable electronic device may be forced to change the design of the conventional memory controller in order to guarantee the resultant performance of the conventional portable electronic device, and additional costs such as labor costs and material costs may be introduced. Thus, a novel method is required for enhancing the basic design architecture and improving the design environment.

SUMMARY

It is an objective of the claimed invention to provide a method for performing memory interface calibration in an electronic device, and an associated apparatus and an associated memory controller, in order to solve the above-mentioned problems.

It is another objective of the claimed invention to provide a method for performing memory interface calibration in an electronic device, and an associated apparatus and an associated memory controller, in order to enhance the flexibility of internal components of the electronic device.

It is another objective of the claimed invention to provide a method for performing memory interface calibration in an electronic device, and an associated apparatus and an associated memory controller, in order to guarantee the performance of the electronic device and to improve the design environment.

According to at least one preferred embodiment, a method for performing memory interface calibration in an electronic device is provided, where the method is applied to a memory controller of the electronic device. The method comprises the steps of: dynamically controlling a signal on a digital terminal of the memory controller to switch between a plurality of levels, wherein the digital terminal is coupled to a memory of the electronic device; and by detecting the signal, calibrating a logical state of the signal to correspond to a level of the plurality of levels. For example, the number of levels in the plurality of levels may be greater than two. In another example, the number of levels in the plurality of levels may be equal to or greater than two. In particular, the step of calibrating the logical state of the signal to correspond to the level of the plurality of levels may further comprise: based on at least one detection result obtained from detecting the signal, calibrating the logical state of the signal to correspond to the level of the plurality of levels. More particularly, the memory controller may comprise a plurality of command terminals, a plurality of data terminals, and at least one clock terminal, which are used for coupling the memory controller to the memory. For example, the digital terminal may be a command terminal of the plurality of command terminals. In another example, the digital terminal may be a data terminal of the plurality of data terminals.

According to at least one preferred embodiment, an apparatus for performing memory interface calibration in an electronic device is provided, where the apparatus comprises at least one portion of the electronic device. The apparatus comprises a memory arranged to store information for the electronic device, and further comprises a memory controller arranged to provide the electronic device with a memory access service regarding the memory, where the memory controller is coupled to the memory. In addition, the memory controller dynamically controls a signal on a digital terminal of the memory controller to switch between a plurality of levels, wherein the digital terminal is coupled to a memory of the electronic device. For example, the number of levels in the plurality of levels may be greater than two. In another example, the number of levels in the plurality of levels may be equal to or greater than two. Additionally, by detecting the signal, the memory controller calibrates a logical state of the signal to correspond to a level of the plurality of levels. In particular, based on at least one detection result obtained from detecting the signal, the memory controller calibrates the logical state of the signal to correspond to the level of the plurality of levels. More particularly, the memory controller may comprise a plurality of command terminals, a plurality of data terminals, and at least one clock terminal, which are used for coupling the memory controller to the memory. For example, the digital terminal may be a command terminal of the plurality of command terminals. In another example, the digital terminal may be a data terminal of the plurality of data terminals.

According to at least one preferred embodiment, a memory controller for performing memory interface calibration in an electronic device is provided. The memory controller comprises a digital terminal, wherein the digital terminal is used for coupling the memory controller to a memory of the electronic device. More particularly, the memory controller further comprises a control unit that is coupled to the digital terminal. In addition, the control unit is arranged to dynamically control a signal on the digital terminal of the memory controller to switch between a plurality of levels. For example, the number of levels in the plurality of levels may be greater than two. In another example, the number of levels in the plurality of levels may be equal to or greater than two. Additionally, by detecting the signal, the control unit calibrates a logical state of the signal to correspond to a level of the plurality of levels. In particular, based on at least one detection result obtained from detecting the signal, the control unit calibrates the logical state of the signal to correspond to the level of the plurality of levels. More particularly, the memory controller may comprise a plurality of command terminals, a plurality of data terminals, and at least one clock terminal, which are used for coupling the memory controller to the memory. For example, the digital terminal may be a command terminal of the plurality of command terminals. In another example, the digital terminal may be a data terminal of the plurality of data terminals.

It is an advantage of the present invention that the present invention method and the associated apparatus and the associated memory controller can enhance the flexibility of internal components of the electronic device and guarantee the performance of the electronic device. In addition, in contrast to the related art, the present invention method and the associated apparatus and the associated memory controller can reduce the bit error rate of the transmission between the memory and the memory controller that accesses the memory.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
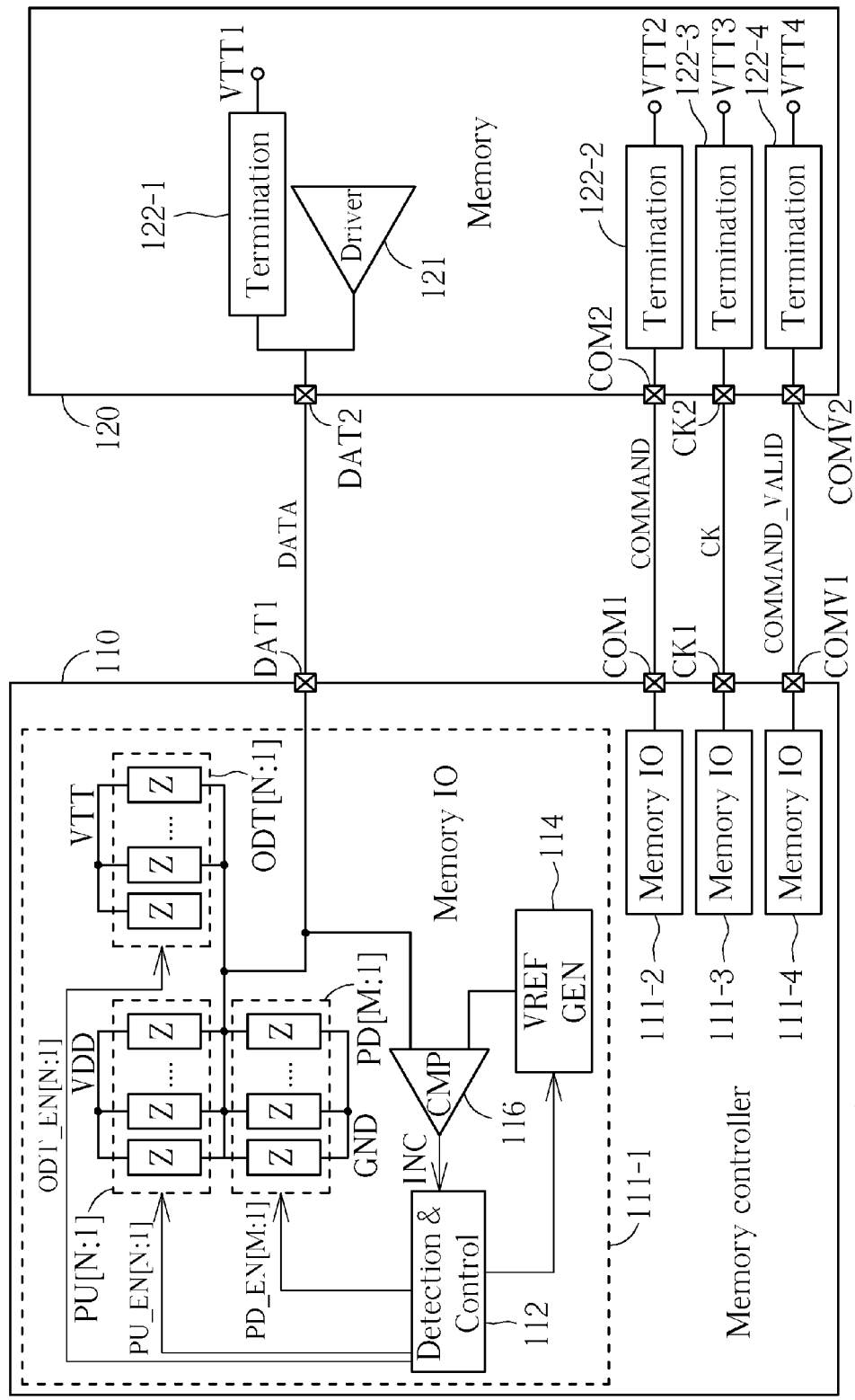
FIG. 1 is a diagram of an apparatus for performing memory interface calibration in an electronic device according to a first embodiment of the present invention.

Please refer to FIG. 1, which illustrates a diagram of an apparatus 100 for performing memory interface calibration in an electronic device according to a first embodiment of the present invention, where the apparatus 100 may comprise at least one portion (e.g. a portion or all) of the electronic device. For example, the apparatus 100 may comprise a portion of the electronic device mentioned above, and more particularly, can be at least one hardware circuit such as at least one integrated circuit (IC) within the electronic device. In another example, the apparatus 100 can be the whole of the electronic device mentioned above. In another example, the apparatus 100 may comprise a system comprising the electronic device mentioned above (e.g. an audio/video system comprising the electronic device). Examples of the electronic device may include, but not limited to, a mobile phone (e.g. a multifunctional mobile phone), a personal digital assistant (PDA), and a personal computer such as a laptop computer.

As shown in FIG. 1, the apparatus 100 may comprise a memory controller 110 and a memory 120, where the memory controller 110 is coupled to the memory 120. According to this embodiment, the memory 120 is arranged to store information for the electronic device, and the memory controller 110 is arranged to provide the electronic device with a memory access service regarding the memory 120. More particularly, the memory controller 110 may comprise at least one command terminal (e.g. one or more command terminals) such as a command terminal COM1, at least one data terminal (e.g. one or more data terminals) such as a data terminal DAT1, at least one clock terminal (e.g. one or more clock terminals) such as a clock terminal CK1, and at least one command valid-control terminal (e.g. one or more command valid-control terminals) such as a command valid-control terminal COMV1, which are used for coupling the memory controller 110 to the memory 120, where the memory 120 may comprise a corresponding command terminal COM2, a corresponding data terminal DAT2, a corresponding clock terminal CK2, and a corresponding command valid-control terminal COMV2. For example, the command terminal COM1 is coupled to the command terminal COM2 through a command line COMMAND, the data terminal DAT1 is coupled to the data terminal DAT2 through a data line DATA, the clock terminal CK1 is coupled to the clock terminal CK2 through a clock line CK, and the command valid-control terminal COMV1 is coupled to the command valid-control terminal COMV2 through a command valid-control line COMMAND_VALID. This is for illustrative purposes only, and is not meant to be a limitation of the present invention. For example, at least one portion (e.g. a portion or all) of the terminals of the memory controller 110 may be varied. In another example, at least one portion (e.g. a portion or all) of the terminals of the memory 120 may be varied. In another example, at least one portion (e.g. a portion or all) of the terminals of the memory controller 110 and at least one portion (e.g. a portion or all) of the terminals of the memory 120 may be varied. In some examples, the connections between the memory controller 110 and the memory 120 may be varied.

For better comprehension, some implementation details of the memory controller 110 and the memory 120 are further illustrated in FIG. 1. For example, the memory controller 110 may further comprise a plurality of memory input/output (IO) modules 111-1, 111-2, 111-3, and 111-4, which can be regarded as memory interface circuits of the memory controller 110, with the memory IO modules 111-1, 111-2, 111-3, and 111-4 corresponding to the data terminal DAT1, the command terminal COM1, the clock terminal CK1, and the command valid-control terminal COMV1, respectively. For brevity, each of the memory IO modules 111-1, 111-2, 111-3, and 111-4 can also be referred to as "memory IO". In addition, the memory 120 may comprise at least one driver such as the driver 121, and may further comprise a plurality of termination modules 122-1, 122-2, 122-3, and 122-4, which can be referred to as terminations of the memory 120, with the termination modules 122-1, 122-2, 122-3, and 122-4 corresponding to the data terminal DAT2, the command terminal COM2, the clock terminal CK2, and the command valid-control terminal COMV2, respectively. More particularly, the memory 120 may selectively enable one of the driver 121 and the termination module 122-1. For example, in a situation where the data terminal DAT2 of the memory 120 is arranged to input data into the memory 120, the memory 120 may enable the termination module 122-1 and disable the driver 121. In another example, in a situation where the data terminal DAT2 of the memory 120 is arranged to output data from the memory 120, the memory 120 may enable the driver 121 and disable the termination module 122-1. This is for illustrative purposes only, and is not meant to be a limitation of the present invention.

Taking the memory IO module 111-1 as an example, the memory IO module 111-1 may comprise a control unit such as a detection and control circuit 112, and may further comprise a reference voltage generator 114 (labeled "VREF GEN" in FIG. 1, for brevity), and a comparator 116 (labeled "CMP" in FIG. 1, for brevity). In addition, the memory IO module 111-1 may further comprise a plurality of impedance components, which may comprise a plurality of impedance component sets, where each impedance component set of the plurality of impedance component sets may comprise at least one impedance component (e.g. one or more impedance components). For example, the plurality of impedance component sets may comprise a first impedance component set PU[N:1], a second impedance component set PD[M:1], and a third impedance component set ODT[N:1], where each impedance component set of the first impedance component set PU[N:1] and the third impedance component set ODT[N:1] in this example may comprise N impedance components (e.g. the notation N may represent a positive integer that is greater than one), and the second impedance component set PD[M:1] in this example may comprise M impedance components (e.g. the notation M may represent a positive integer that is greater than one).

More particularly, under control of a corresponding control signal set of a plurality of control signal sets output from the aforementioned control unit such as the detection and control circuit 112, each impedance component set of the plurality of impedance component sets may be arranged to adjust the number of impedance components (within the aforementioned each impedance component set of the plurality of impedance component sets) that are coupled between a digital terminal (which can be the data terminal DAT1 in this example) and a predetermined node of the memory controller 110. For example, under control of a first control signal set PU_EN[N:1] (e.g. N enabling control signals), the first impedance component set PU[N:1] may be arranged to adjust the number of impedance components (within the first impedance component set PU[N:1]) that are coupled between the digital terminal (such as the data terminal DAT1) and the predetermined node such as a voltage driving source node VDD of the memory controller 110. In another example, under control of a second control signal set PD_EN[M:1] (e.g. M enabling control signals), the second impedance component set PD[M:1] may be arranged to adjust the number of impedance components (within the second impedance component set PD[M:1]) that are coupled between the digital terminal (such as the data terminal DAT1) and the predetermined node such as a ground node GND of the memory controller 110. In another example, under control of a third control signal set ODT_EN[N:1] (e.g. N enabling control signals), the third impedance component set ODT[N:1] may be arranged to adjust the number of impedance components (within the third impedance component set ODT[N:1]) that are coupled between the digital terminal (such as the data terminal DAT1) and the predetermined node such as another node VTT of the memory controller 110. This is for illustrative purposes only, and is not meant to be a limitation of the present invention. For example, at least one predetermined node (e.g. one or more predetermined nodes) within the predetermined nodes respectively corresponding to the plurality of impedance component sets may be varied. In another example, the number of impedance component sets within the plurality of impedance component sets may be varied. In some examples, the number of impedance components in each set of at least one set (e.g. one or more sets) of the plurality of impedance component sets may be varied.

In addition, the aforementioned control unit such as the detection and control circuit 112 may perform detection on the signal on the aforementioned digital terminal of the memory controller 110 (e.g. the data terminal DAT1 in some examples, or another terminal of the memory controller 110 in some other examples), i.e. the signal that passes through this digital terminal, to generate a plurality of detection results, in order to perform memory interface calibration regarding this digital terminal of the memory controller 110. For example, based on at least one detection result (e.g. one or more detection results) within the plurality of detection results, the aforementioned control unit such as the detection and control circuit 112 may generate a plurality of control signals, which may comprise the plurality of control signal sets mentioned above, such as the first control signal set PU_EN[N:1] (e.g. N enabling control signals), the second control signal set PDEN[M:1] (e.g. M enabling control signals), and the third control signal set ODTEN[N:1] (e.g. N enabling control signals). As a result, the aforementioned control unit such as the detection and control circuit 112 may dynamically change the impedance between this digital terminal and any of the predetermined nodes when needed, in order to enhance the flexibility of internal components of the electronic device and guarantee the performance of the electronic device. For example, based on the calibration performed by the memory controller 110 (more particularly, the aforementioned control unit such as the detection and control circuit 112) the bit error rate of the transmission between the memory controller 110 and the memory 120 can be reduced.

In practice, under control of the control unit such as a detection and control circuit 112, the reference voltage generator 114 is arranged to generate a reference voltage VREF to be input into a reference voltage input terminal of the comparator 116. In addition, the comparator 116 is arranged to compare at least one target input (e.g. one or more target inputs) that is input into a target input terminal of the comparator 116 with the reference voltage VREF, to generate a comparison result signal INC, where the comparison result signal INC may carry at least one comparison result (e.g. one or more comparison results). For example, with aid of the reference voltage generator 114 and the comparator 116, the aforementioned control unit such as the detection and control circuit 112 may perform detection on the signal on the aforementioned digital terminal of the memory controller 110 (e.g. the data terminal DAT1 in some examples, or another terminal of the memory controller 110 in some other examples), i.e. the signal that passes through this digital terminal, to generate the plurality of detection results mentioned above, in order to perform memory interface calibration regarding this digital terminal of the memory controller 110. This is for illustrative purposes only, and is not meant to be a limitation of the present invention. According to some variations of this embodiment, at least one portion (e.g. a portion or all) of the reference voltage generator 114 and the comparator 116 can be integrated into the control unit such as a detection and control circuit 112. According to some variations of this embodiment, at least one portion (e.g. a portion or all) of the reference voltage generator 114 and the comparator 116 can be omitted, where the control unit such as a detection and control circuit 112 may operate without using the aforementioned at least one portion (e.g. a portion or all) of the reference voltage generator 114 and the comparator 116 in these variations.

Please note that, according to this embodiment, the aforementioned control unit such as the detection and control circuit 112 may generate the aforementioned at least one detection result according to the aforementioned at least one comparison result. This is for illustrative purposes only, and is not meant to be a limitation of the present invention. According to some embodiments of the present invention, such as some variations of the embodiment shown in FIG. 1, the aforementioned control unit such as the detection and control circuit 112 may simply use the aforementioned at least one comparison result as the aforementioned at least one detection result. Therefore, in these variations of the embodiment shown in FIG. 1, the aforementioned at least one comparison result can be taken as an example of the aforementioned at least one detection result.

In addition, for better comprehension, some implementation details regarding the memory IO module 111-1 are illustrated in FIG. 1, where the associated descriptions regarding the memory IO module 111-1 are described above. This is for illustrative purposes only, and is not meant to be a limitation of the present invention. For example, the implementation details regarding the memory IO module 111-1, together with the associated descriptions regarding the memory IO module 111-1, can be applied to any other memory IO module within the plurality of memory IO modules 111-1, 111-2, 111-3, and 111-4 respectively corresponding to the data terminal DAT1, the command terminal COM1, the clock terminal CK1, and the command valid-control terminal COMV1. Similar descriptions for the other memory IO module such as any of the memory IO modules 111-2, 111-3, and 111-4 are not repeated in detail here.

Additionally, the architecture of the embodiment shown in FIG. 1 can be described to operate by utilizing the plurality of impedance components, which may comprise the plurality of impedance component sets mentioned above. This is for illustrative purposes only, and is not meant to be a limitation of the present invention. According to some variations of this embodiment, the plurality of impedance components can be replaced by a plurality of current sources, respectively, where the plurality of current sources may comprise a plurality of current source sets. In addition, in response to the change in the architecture for these variations, the notation "Z" of each of the impedance components shown in FIG. 1 can be replaced by another notation such as "$I_s$", for example.

Figure 2:
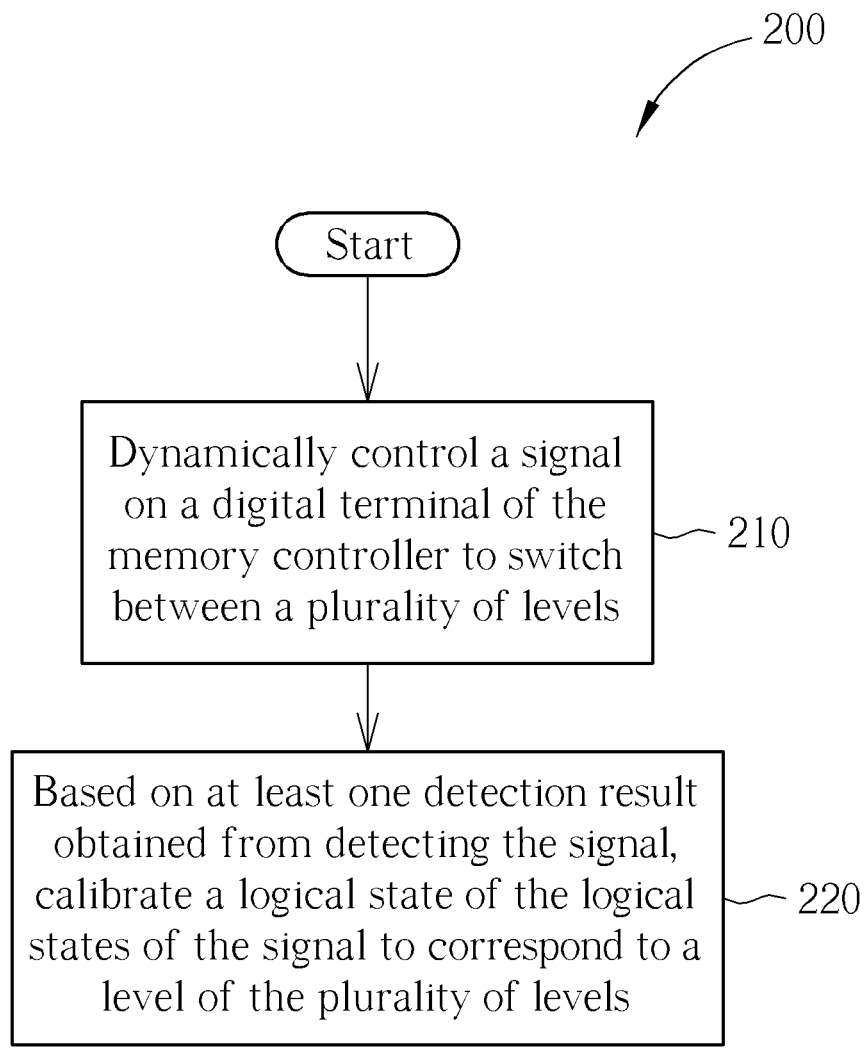
FIG. 2 illustrates a flowchart of a method for performing memory interface calibration in an electronic device according to an embodiment of the present invention.

FIG. 2 illustrates a flowchart of a method 200 for performing memory interface calibration in an electronic device such as that mentioned above according to an embodiment of the present invention. The method 200 shown in FIG. 2 can be applied to the apparatus 100 shown in FIG. 1, and can be applied to the memory controller 110 thereof (more particularly, the aforementioned control unit such as the detection and control circuit 112). The method can be described as follows.

In Step 210, the memory controller 110 (e.g. the control unit such as the detection and control circuit 112) dynamically controls a signal on a digital terminal of the memory controller 110, such as the aforementioned signal on the digital terminal in the embodiment shown in FIG. 1, to switch between a plurality of levels (e.g. a plurality of candidate levels), where the digital terminal is coupled to a memory of the electronic device. For example, the number of levels in the plurality of levels may be greater than two. This is for illustrative purposes only, and is not meant to be a limitation of the present invention. In another example, the number of levels in the plurality of levels may be equal to or greater than two.

In Step 220, based on at least one detection result obtained from detecting the signal mentioned in Step 210, such as the aforementioned at least one detection result in the embodiment shown in FIG. 1 (e.g. one or more detection results), the memory controller 110 (e.g. the control unit such as the detection and control circuit 112) calibrates a logical state of the signal to correspond to a level of the plurality of levels. For example, based on the aforementioned at least one detection result obtained from detecting the signal, the memory controller 110 (e.g. the control unit such as the detection and control circuit 112) may calibrate this logical state of the signal to correspond to this level of the plurality of levels and calibrate another logical state of the signal to correspond to another level of the plurality of levels. This is for illustrative purposes only, and is not meant to be a limitation of the present invention. In another example, the memory controller 110 (e.g. the control unit such as the detection and control circuit 112) may perform calibration for only one logical state of the signal, such as this logical state mentioned in Step 210.

According to this embodiment, the memory controller 110 (e.g. the control unit such as the detection and control circuit 112) may dynamically switch between a plurality of configurations of the memory controller to dynamically control the signal mentioned in Step 210 to switch between the plurality of levels. More particularly, the memory controller 110 may dynamically change at least one control signal corresponding to at least one impedance component in an impedance component set of a plurality of impedance components within the electronic device, such as any impedance component set of the plurality of impedance components mentioned in the embodiment shown in FIG. 1, to dynamically switch between the plurality of configurations of the memory controller 110. For example, the memory controller 110 may use a control signal corresponding to an impedance component of the impedance component set to selectively enable a conduction path between the digital terminal and a node of the memory controller 110 (e.g. the predetermined node mentioned above, such as one of the voltage driving source node VDD, the ground node GND, and the other node VTT in the embodiment shown in FIG. 1), where this conduction path between the digital terminal and the node passes through this impedance component of the impedance component set. This is for illustrative purposes only, and is not meant to be a limitation of the present invention. According to some variations of this embodiment, the memory controller 110 may further dynamically change at least one control signal corresponding to at least one impedance component in another impedance component set of the plurality of impedance components to dynamically switch between the plurality of configurations of the memory controller 110. More particularly, the memory controller 110 may use a control signal corresponding to an impedance component of the impedance component set (e.g. the control signal corresponding to the same impedance component mentioned in the embodiment shown in FIG. 2) to selectively enable a conduction path between the digital terminal (i.e. the same digital terminal mentioned in the embodiment shown in FIG. 2) and a node of the memory controller 110 (e.g. the same node mentioned in the embodiment shown in FIG. 2, and more particularly, an example of the predetermined node mentioned above, such as one of the voltage driving source node VDD, the ground node GND, and the other node VTT in the embodiment shown in FIG. 1), where the conduction path between this digital terminal and this node passes through this impedance component of the impedance component set. In addition, the memory controller 110 may further use a control signal corresponding to an impedance component of the other impedance component set of these variations to selectively enable a conduction path between the digital terminal (i.e. the same digital terminal mentioned in the embodiment shown in FIG. 2) and another node of the memory controller 110 (e.g. another example of the predetermined node mentioned above, such as anther one of the voltage driving source node VDD, the ground node GND, and the other node VTT in the embodiment shown in FIG. 1), where the conduction path between this digital terminal and the other node passes through the impedance component of the other impedance component set.

In this embodiment, the method 200 shown in FIG. 2 can be described to utilize the plurality of impedance components, which may comprise the plurality of impedance component sets mentioned above. This is for illustrative purposes only, and is not meant to be a limitation of the present invention. According to some variations of this embodiment, the plurality of impedance components can be replaced by a plurality of current sources such as that mentioned above, respectively, where the plurality of current sources may comprise a plurality of current source sets such as that mentioned above.

More particularly, in a first set of variations within these variations of this embodiment, the memory controller 110 may dynamically change at least one control signal corresponding to at least one current source in a current source set of a plurality of current sources within the electronic device, such as any current source set of the plurality of current sources mentioned above, to dynamically switch between the plurality of configurations of the memory controller 110. For example, the memory controller 110 may use a control signal corresponding to a current source of the current source set to selectively enable a conduction path between the digital terminal and a node of the memory controller 110 (e.g. the predetermined node mentioned above, such as one of the voltage driving source node VDD, the ground node GND, and the other node VTT in the aforementioned variations of the embodiment shown in FIG. 1 with the plurality of impedance components being replaced by the plurality of current sources, respectively), where this conduction path between the digital terminal and the node passes through this current source of the current source set. This is for illustrative purposes only, and is not meant to be a limitation of the present invention. According to a second set of variations within these variations of this embodiment, the memory controller 110 may further dynamically change at least one control signal corresponding to at least one current source in another current source set of the plurality of current sources to dynamically switch between the plurality of configurations of the memory controller 110. More particularly, the memory controller 110 may use a control signal corresponding to a current source of the current source set (e.g. the control signal corresponding to the same current source mentioned in the first set of variations within these variations of this embodiment) to selectively enable a conduction path between the digital terminal (i.e. the same digital terminal mentioned in the first set of variations within these variations of this embodiment) and a node of the memory controller 110 (e.g. the same node mentioned in the first set of variations within these variations of this embodiment, and more particularly, an example of the predetermined node mentioned above, such as one of the voltage driving source node VDD, the ground node GND, and the other node VTT in the aforementioned variations of the embodiment shown in FIG. 1 with the plurality of impedance components being replaced by the plurality of current sources, respectively), where the conduction path between this digital terminal and this node passes through this current source of the current source set. In addition, the memory controller 110 may further use a control signal corresponding to a current source of the other current source set of the second set of variations to selectively enable a conduction path between the digital terminal (i.e. the same digital terminal mentioned in the first set of variations within these variations of this embodiment) and another node of the memory controller 110 (e.g. another example of the predetermined node mentioned above, such as anther one of the voltage driving source node VDD, the ground node GND, and the other node VTT in the aforementioned variations of the embodiment shown in FIG. 1 with the plurality of impedance components being replaced by the plurality of current sources, respectively), where the conduction path between this digital terminal and the other node passes through the current source of the other current source set.

According to the embodiment shown in FIG. 2, the aforementioned at least one detection result may comprise a duty cycle detection result. In addition, under control of the memory controller 110 (e.g. the control unit such as the detection and control circuit 112), in a situation where a condition regarding the duty cycle detection result is satisfied, the logical state of the signal is calibrated to correspond to the level of the plurality of levels in Step 210. More particularly, under control of the memory controller 110 (e.g. the control unit such as the detection and control circuit 112), when the duty cycle detection result indicates that a duty cycle of the signal mentioned in Step 210 is equal to a predetermined percentage, the logical state of this signal is calibrated to correspond to the level of the plurality of levels in Step 210. For example, the predetermined percentage is equivalent to 50%. This is for illustrative purposes only, and is not meant to be a limitation of the present invention. According to a variation of this embodiment, when the duty cycle detection result mentioned above indicates that a duty cycle of the signal mentioned in Step 210 falls within a range of a predetermined interval comprising the predetermined percentage mentioned above, the logical state of this signal is calibrated to correspond to the level of the plurality of levels in Step 210.

According to another variation of this embodiment, the aforementioned at least one detection result may comprise a common mode level detection result. In addition, under control of the memory controller 110 (e.g. the control unit such as the detection and control circuit 112), when the common mode level detection result indicates that a common mode level of the signal mentioned in Step 210 is equivalent to a predetermined level, the logical state of this signal is calibrated to correspond to the level of the plurality of levels in Step 210.

According to some embodiments of the present invention, such as the embodiment shown in FIG. 2 and some variations thereof, the digital terminal mentioned in Step 210 can be a data terminal of the memory controller 110, such as any data terminal of the aforementioned at least one data terminal in the embodiment shown in FIG. 1. For better comprehension, the data terminal DAT1 can be taken as an example of this data terminal in one or more of these embodiments. More particularly, the memory controller 110 (e.g. the control unit such as the detection and control circuit 112) may send at least one command through a command terminal of the memory controller 110, such as any command terminal of the aforementioned at least one command terminal in the embodiment shown in FIG. 1, to the memory 120 to cause the signal mentioned in Step 210 to be output from the memory 120, where switching the signal from one of the plurality of levels to another of the plurality of levels in Step 210 is controlled by the memory controller 110. For better comprehension, the command terminal COM1 can be taken as an example of this command terminal in one or more of these embodiments. For example, the memory controller 110 (e.g. the control unit such as the detection and control circuit 112) may use the aforementioned at least one command to instruct the memory 120 to control the signal mentioned in Step 210 to have a data pattern that alternatively switches between the logical value 0 and the logical value 1, where the logical value 0 and the logical value 1 can be taken as examples of possible logical states of the signal mentioned in Step 210. This is for illustrative purposes only, and is not meant to be a limitation of the present invention. In another example, the memory controller 110 (e.g. the control unit such as the detection and control circuit 112) may use the aforementioned at least one command to instruct the memory 120 to control the signal mentioned in Step 210 to have a data pattern of a single logical value (e.g. any of the logical value 0 and the logical value 1 mentioned above), rather than a data pattern that alternatively switches between different logical values (e.g. the logical value 0 and the logical value 1 mentioned above).

According to some embodiments of the present invention, such as some variations of the embodiment shown in FIG. 2, the memory controller 110 may comprise a plurality of command terminals (e.g. the aforementioned one or more command terminal in the embodiment shown in FIG. 1), a plurality of data terminals (e.g. the aforementioned one or more data terminal in the embodiment shown in FIG. 1), and at least one clock terminal (e.g. the aforementioned at least one clock terminal in the embodiment shown in FIG. 1), which are used for coupling the memory controller 110 to the memory 120. For example, the digital terminal mentioned in Step 210 can be a command terminal of the plurality of command terminals. In another example, the digital terminal mentioned in Step 210 can be a data terminal of the plurality of data terminals. This is for illustrative purposes only, and is not meant to be a limitation of the present invention.

According to some embodiments of the present invention, such as some variations of the embodiment shown in FIG. 2, the memory controller 110 (e.g. the control unit such as the detection and control circuit 112) may detect a common mode level of the signal mentioned in Step 210, and may further determine a slicing level according to this common mode level, where this slicing level can be used for parsing the signal mentioned in Step 210 to determine at least one logical state of this signal. This is for illustrative purposes only, and is not meant to be a limitation of the present invention.

Figure 3:
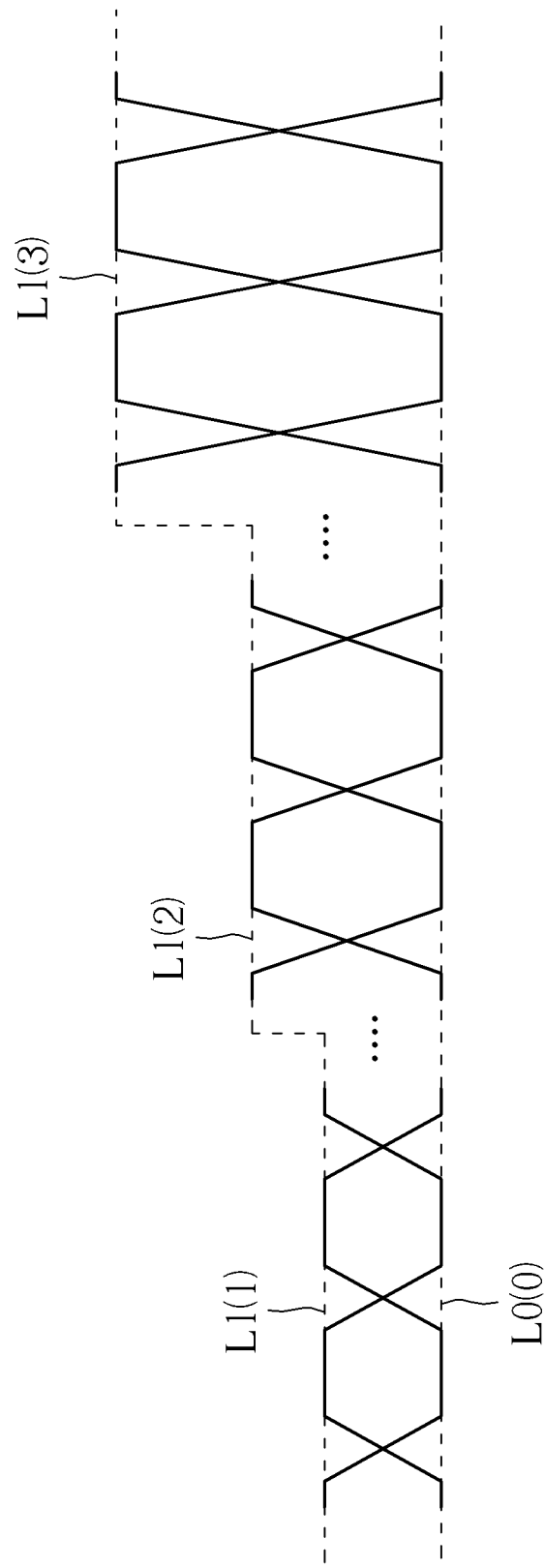
FIG. 3 illustrates a set of levels involved with the method shown in FIG. 2 according to an embodiment of the present invention.

FIG. 3 illustrates a set of levels {L0, L1(1), L1(2), L1(3)} involved with the method 200 shown in FIG. 2 according to an embodiment of the present invention, where this set of levels {L0, L1(1), L1(2), L1(3)} can be taken as an example of the plurality of levels mentioned in Step 210. For example, as shown in FIG. 3, the levels L1(1), L1(2), and L1(3) in this set of levels {L0, L1(1), L1(2), L1(3)} may look like the shape of a flight of stairs. This is for illustrative purposes only, and is not meant to be a limitation of the present invention. For example, at least one portion (e.g. a portion or all) of the plurality of levels may have a uniform distribution in some variations of this embodiment, while at least one portion (e.g. a portion or all) of the plurality of levels may have a non-uniform distribution in some other variations of this embodiment.

Figure 4:
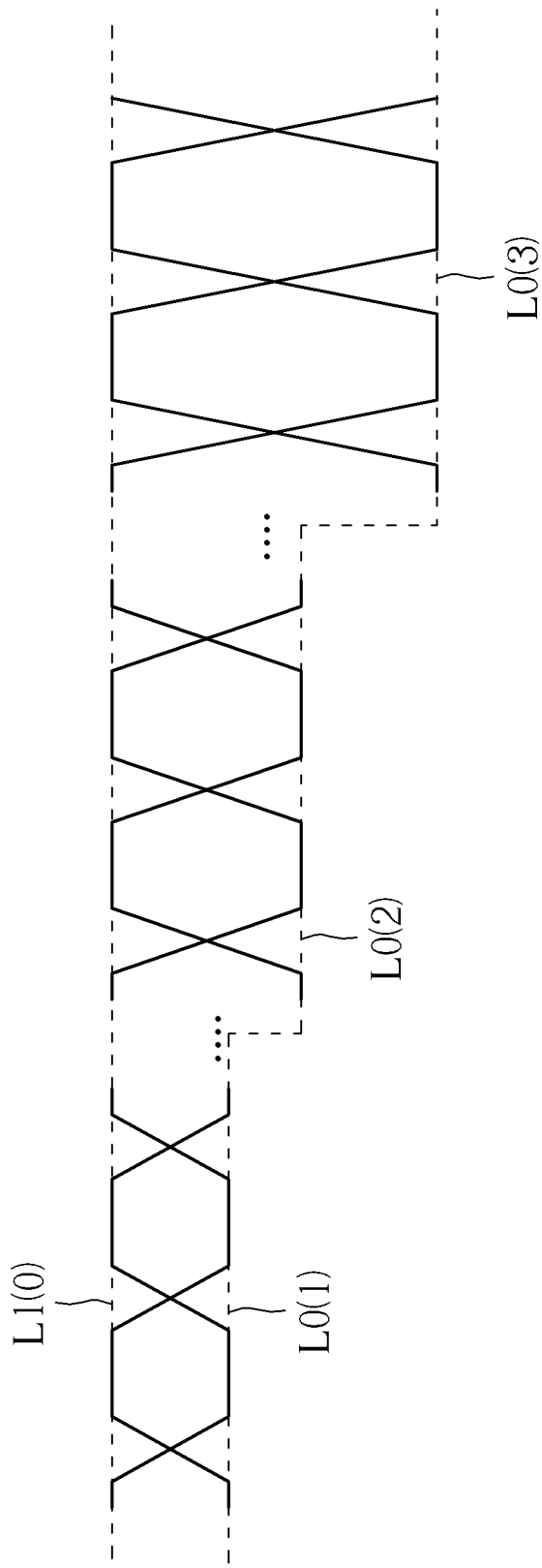
FIG. 4 illustrates a set of levels involved with the method shown in FIG. 2 according to another embodiment of the present invention.

FIG. 4 illustrates a set of levels {L0(1), L0(2), L0(3), L1(0)} involved with the method 200 shown in FIG. 2 according to another embodiment of the present invention, where this set of levels {L0(1), L0(2), L0(3), L1(0)} can be taken as an example of the plurality of levels mentioned in Step 210. For example, as shown in FIG. 4, the levels L0(1), L0(2), and L0(3) in this set of levels {L0(1), L0(2), L0(3), L1(0)} may look like the shape of a flight of stairs. This is for illustrative purposes only, and is not meant to be a limitation of the present invention. For example, at least one portion (e.g. a portion or all) of the plurality of levels may have a uniform distribution in some variations of this embodiment, while at least one portion (e.g. a portion or all) of the plurality of levels may have a non-uniform distribution in some other variations of this embodiment.

Figure 5:
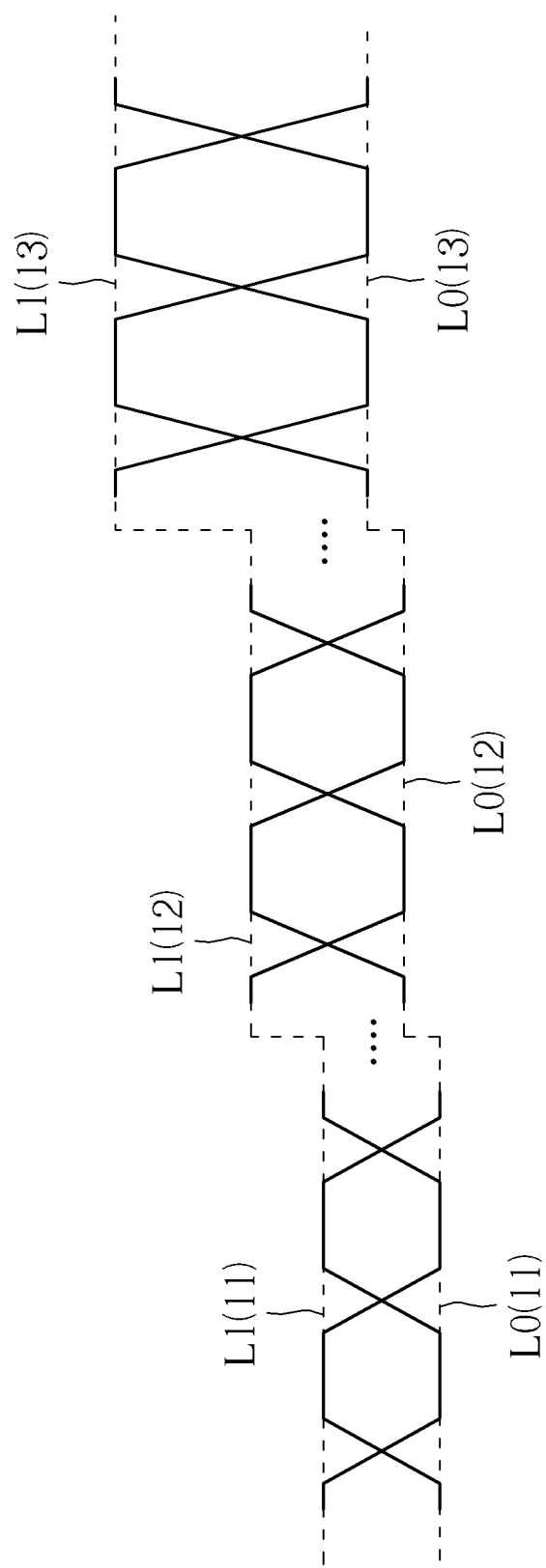
FIG. 5 illustrates a set of levels involved with the method shown in FIG. 2 according to another embodiment of the present invention.

FIG. 5 illustrates a set of levels {L0(11), L0(12), L0(13), L1(11), L1(12), L1(13)} involved with the method 200 shown in FIG. 2 according to another embodiment of the present invention, where this set of levels {L0(11), L0(12), L0(13), L1(11), L1(12), L1(13)} can be taken as an example of the plurality of levels mentioned in Step 210. For example, as shown in FIG. 5, the levels L0(11), L0(12), and L0(13) in this set of levels {L0(11), L0(12), L0(13), L1(11), L1(12), L1(13)} may look like the shape of a flight of stairs. In another example, the levels L1(11), L1(12), and L1(13) in this set of levels {L0(11), L0(12), L0(13), L1(11), L1(12), L1(13)} may look like the shape of a flight of stairs. This is for illustrative purposes only, and is not meant to be a limitation of the present invention. For example, at least one portion (e.g. a portion or all) of the plurality of levels may have a uniform distribution in some variations of this embodiment, while at least one portion (e.g. a portion or all)

of the plurality of levels may have a non-uniform distribution in some other variations of this embodiment.

Figure 6:
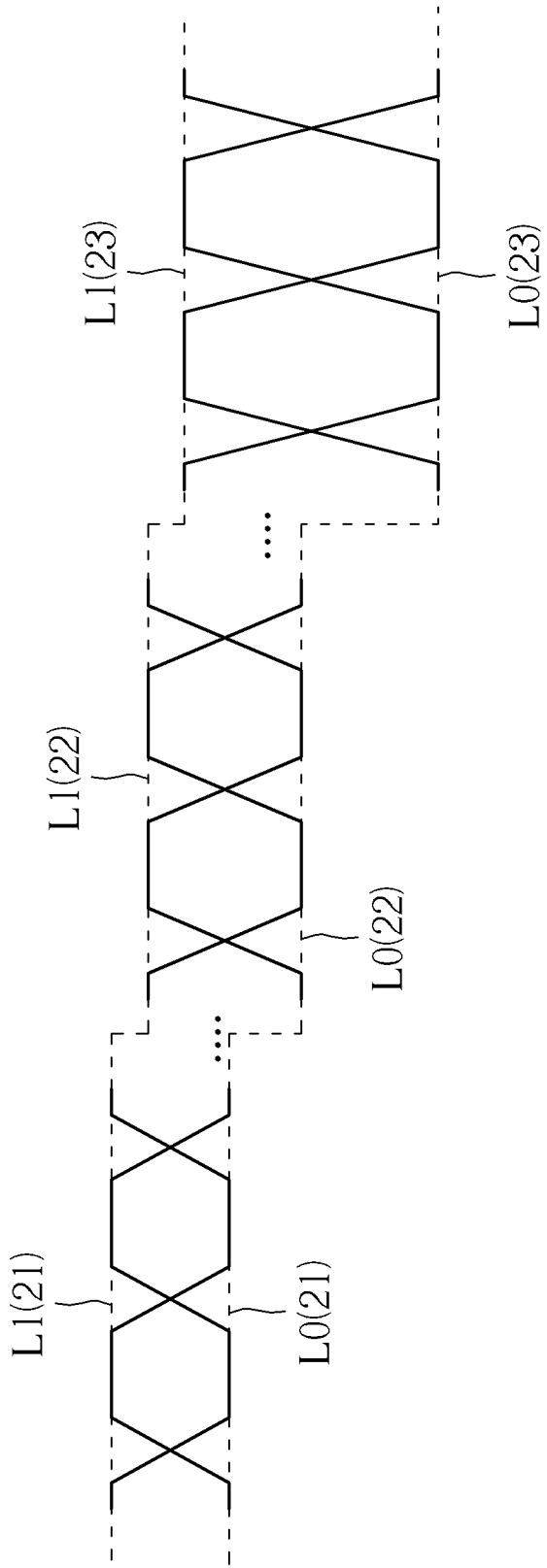
FIG. 6 illustrates a set of levels involved with the method shown in FIG. 2 according to another embodiment of the present invention.

FIG. 6 illustrates a set of levels {L0(21), L0(22), L0(23), L1(21), L1(22), L1(23)} involved with the method 200 shown in FIG. 2 according to another embodiment of the present invention, where this set of levels {L0(21), L0(22), L0(23), L1(21), L1(22), L1(23)} can be taken as an example of the plurality of levels mentioned in Step 210. For example, as shown in FIG. 6, the levels L0(21), L0(22), and L0(23) in this set of levels {L0(21), L0(22), L0(23), L1(21), L1(22), L1(23)} may look like the shape of a flight of stairs. In another example, the levels L1(21), L1(22), and L1(23) in this set of levels {L0(21), L0(22), L0(23), L1(21), L1(22), L1(23)} may look like the shape of a flight of stairs. This is for illustrative purposes only, and is not meant to be a limitation of the present invention. For example, at least one portion (e.g. a portion or all) of the plurality of levels may have a uniform distribution in some variations of this embodiment, while at least one portion (e.g. a portion or all) of the plurality of levels may have a non-uniform distribution in some other variations of this embodiment.

Figure 7:
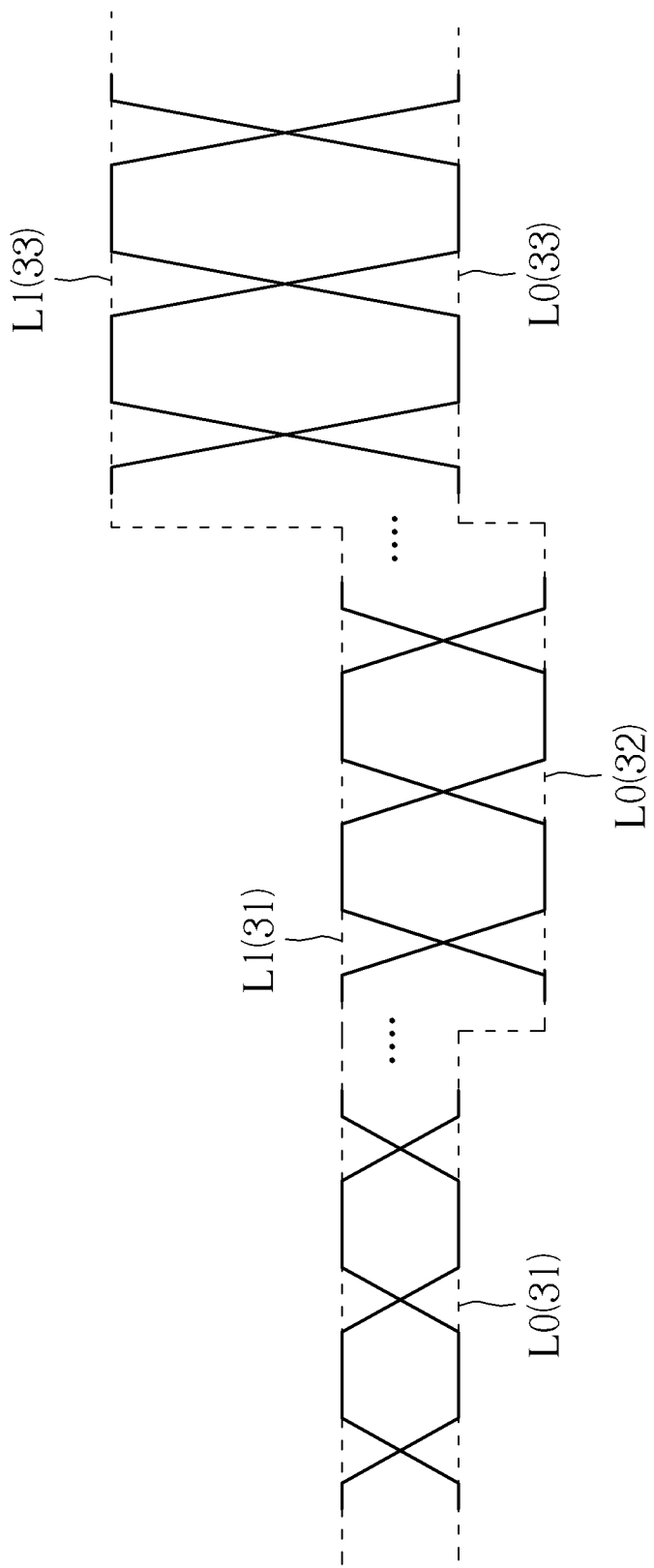
FIG. 7 illustrates a set of levels involved with the method shown in FIG. 2 according to another embodiment of the present invention.

FIG. 7 illustrates a set of levels {L0(31), L0(32), L0(33), L1(31), L1(33)} involved with the method 200 shown in FIG. 2 according to another embodiment of the present invention, where this set of levels {L0(31), L0(32), L0(33), L1(31), L1(33)} can be taken as an example of the plurality of levels mentioned in Step 210. For example, as shown in FIG. 7, the levels L0(31), L0(32), and L0(33) in this set of levels {L0(31), L0(32), L0(33), L1(31), L1(33)} may look like a connection between different stairways. In another example, the levels L1(31) and L1(33) in this set of levels {L0(31), L0(32), L0(33), L1(31), L1(33)} may look like a portion of a stairway. This is for illustrative purposes only, and is not meant to be a limitation of the present invention. For example, at least one portion (e.g. a portion or all) of the plurality of levels may have a uniform distribution in some variations of this embodiment, while at least one portion (e.g. a portion or all) of the plurality of levels may have a non-uniform distribution in some other variations of this embodiment.

Figure 8:
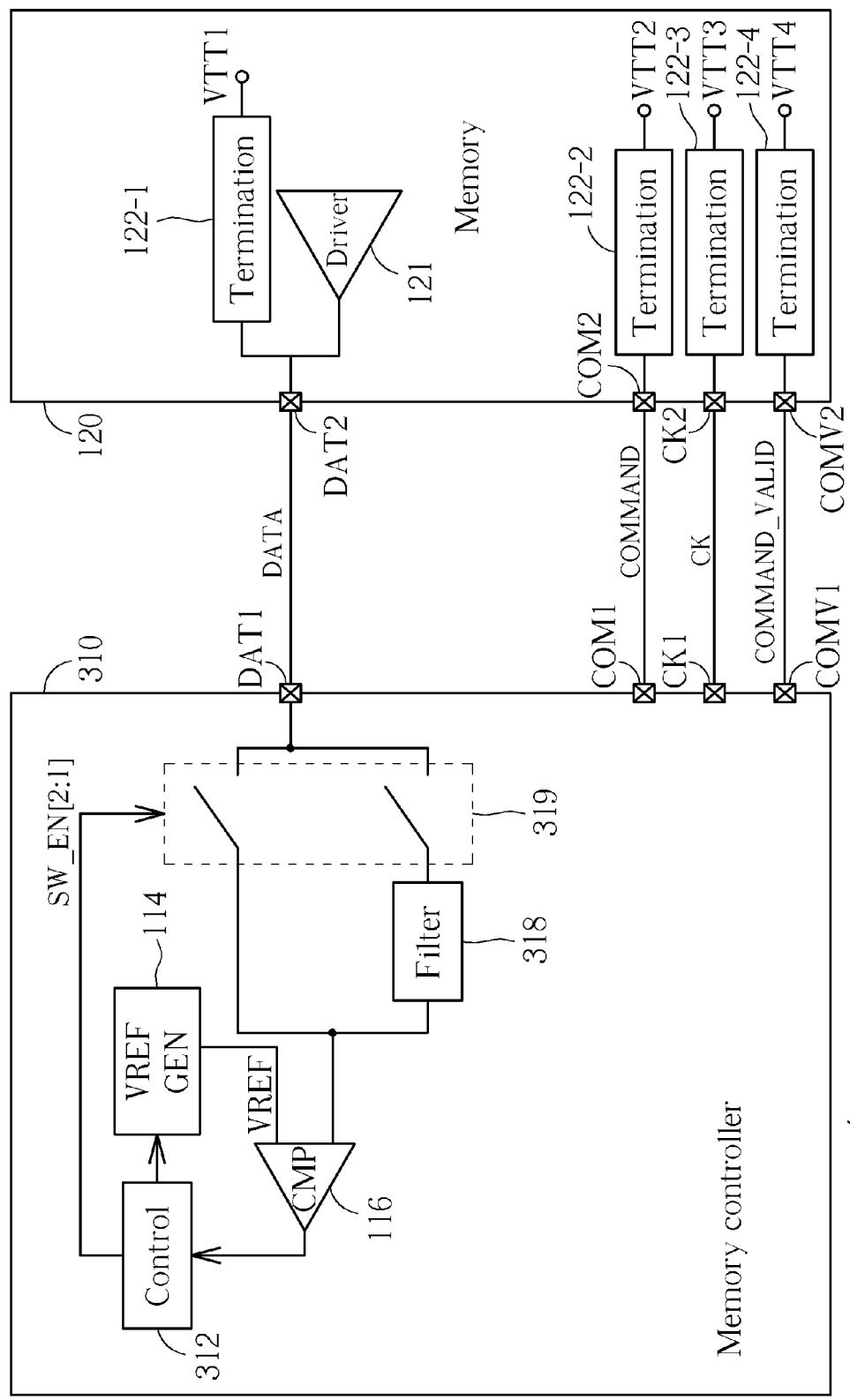
FIG. 8 illustrates a control scheme involved with the method shown in FIG. 2 according to an embodiment of the present invention.

FIG. 8 illustrates a control scheme involved with the method 200 shown in FIG. 2 according to an embodiment of the present invention. The control unit 312 can be taken as an example of the control unit mentioned in the embodiment shown in FIG. 1. For example, the control unit 312 can be implemented by altering the detection and control circuit 112 shown in FIG. 1. In response to the change in architecture, the memory controller mentioned above is labeled with the new numeral 310, and the apparatus mentioned above is labeled with the new numeral 100-1.

As shown in FIG. 8, the memory controller 310 comprises the control unit 312 mentioned above, and further comprises the aforementioned reference voltage generator 114 (labeled "VREF GEN" in FIG. 8, for brevity) and the aforementioned comparator 116 (labeled "CMP" in FIG. 8, for brevity) that are described in the embodiment shown in FIG. 1. In addition to the control unit 312, the reference voltage generator 114, and the comparator 116, the memory controller 310 further comprises a filter 318 and a set of switches 319. According to this embodiment, the control unit 312 may determine the magnitude of the reference voltage VREF to be input into the reference voltage input terminal of the comparator 116, and may control the reference voltage generator 114 to generate the reference voltage VREF having the magnitude determined by the control unit 312. In addition, the control unit 312 may generate a control signal set SWEN[N:1] (e.g. two enabling control signals such as two switching control signals) to selectively enable one of the two paths between the data terminal DAT1 and the target input terminal of the comparator 116. As a result, the control unit 312 may selectively use the filter 318 to perform a filtering operation on the signal passing through the data terminal DAT1. For example, in a situation where the control unit 312 enables the lower path of these two paths, the control unit 312 may use the filter 318 to perform the filtering operation on the signal passing through the data terminal DAT1, to obtain (or determine) the aforementioned common mode level of the signal mentioned in Step 210. In another example, in a situation where the control unit 312 enables the upper path of these two paths, the control unit 312 may use the comparator 116 to compare the signal mentioned in Step 210 with the reference voltage VREF. Therefore, in this embodiment, under control of the memory controller 110 (e.g. the control circuit 312), when the common mode level detection result indicates that the common mode level of the signal mentioned in Step 210 is equivalent to the predetermined level mentioned above, the logical state of this signal is calibrated to correspond to the level of the plurality of levels in Step 210. Similar descriptions for this embodiment are not repeated in detail here.

Figure 9:
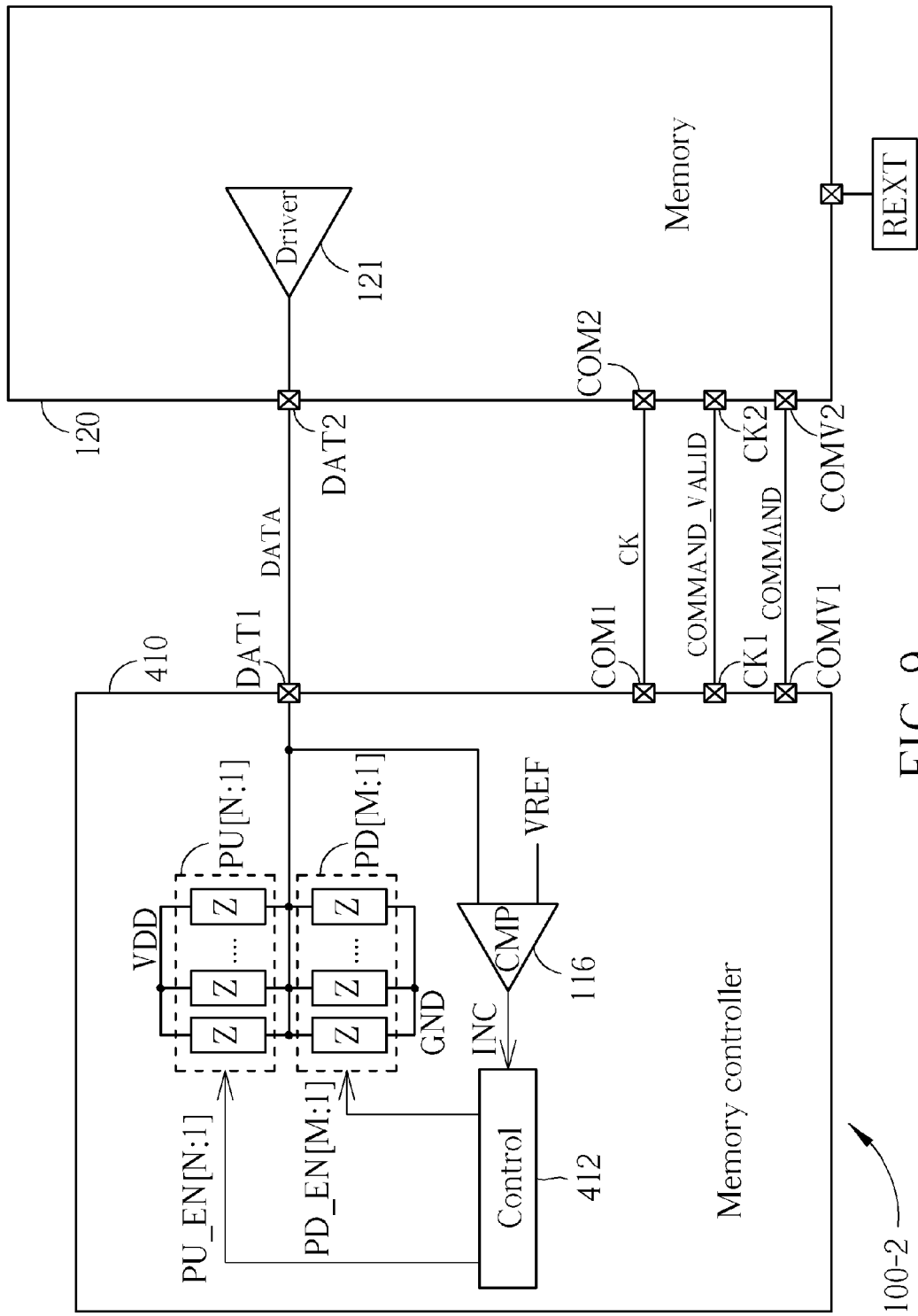
FIG. 9 illustrates a control scheme involved with the method shown in FIG. 2 according to another embodiment of the present invention.

FIG. 9 illustrates a control scheme involved with the method 200 shown in FIG. 2 according to another embodiment of the present invention. The control unit 412 can be taken as an example of the control unit mentioned in the embodiment shown in FIG. 1. For example, the control unit 412 can be implemented by altering the detection and control circuit 112 shown in FIG. 1. In response to the change in architecture, the memory controller mentioned above is labeled with the new numeral 410, and the apparatus mentioned above is labeled with the new numeral 100-2. In addition, the memory 120 of this embodiment may be coupled to at least one external terminal module (e.g. one or more external terminal modules) positioned outside the memory 120, such as the external terminal module REXT shown in FIG. 9. For example, the external terminal module REXT can be an external impedance component such as a resistor positioned outside the memory 120.

As shown in FIG. 9, the memory controller 410 comprises the control unit 412 mentioned above, and further comprises the aforementioned comparator 116 (labeled "CMP" in FIG. 9, for brevity), the aforementioned first impedance component set PU[N:1], and the aforementioned second impedance component set PD[M:1] that are described in the embodiment shown in FIG. 1. In addition, the control unit 412 may use the comparator 116 to compare the signal mentioned in Step 210 with the reference voltage VREF. For example, the reference voltage VREF can be a reference voltage whose magnitude is equivalent to a fixed value, rather than being adjustable. This is for illustrative purposes only, and is not meant to be a limitation of the present invention. In another example, the reference voltage VREF can be adjustable. According to this embodiment, the aforementioned control unit such as the control circuit 412 may generate the aforementioned at least one detection result according to the aforementioned at least one comparison result, rather than simply using the aforementioned at least one comparison result as the aforementioned at least one detection result. Similar descriptions for this embodiment are not repeated in detail here.

Please note that, the reference voltage VREF of the embodiment shown in FIG. 9 can be the aforementioned reference voltage whose magnitude is equivalent to the fixed value. This is for illustrative purposes only, and is not meant to be a limitation of the present invention. According to some embodiments of the present invention, such as some variations of the embodiment shown in FIG. 9, in a situation where the memory controller 410 comprises the reference voltage generator 114 mentioned above, the control unit 412 may determine the magnitude of the reference voltage VREF to be input into the reference voltage input terminal of the comparator 116, and may control the reference voltage generator 114 to generate the reference voltage VREF having the magnitude determined by the control unit 412. Similar descriptions for these embodiments are not repeated in detail here.

In addition, the architecture of the embodiment shown in FIG. 9 can be described to operate by utilizing the plurality of impedance components, which may comprise the plurality of impedance component sets mentioned above. This is for illustrative purposes only, and is not meant to be a limitation of the present invention. According to some variations of this embodiment, the plurality of impedance components can be replaced by the plurality of current sources mentioned above, respectively. In response to the change in the architecture for these variations, the notation "Z" of each of the impedance components shown in FIG. 9 can be replaced by another notation such as "$I_s$", for example. For brevity, similar descriptions for these variations are not repeated in detail here.

Figure 10:
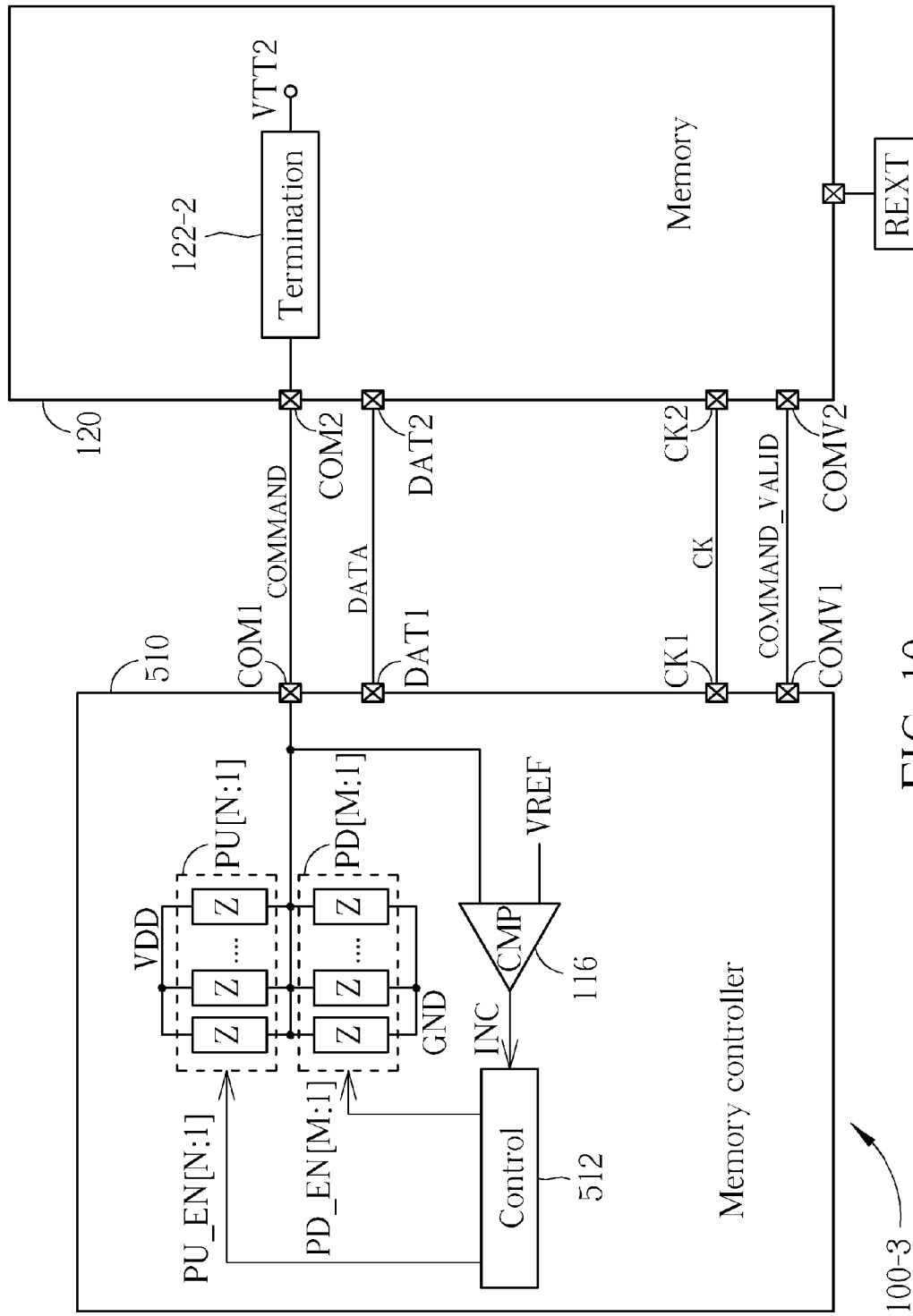
FIG. 10 illustrates a control scheme involved with the method shown in FIG. 2 according to another embodiment of the present invention.

FIG. 10 illustrates a control scheme involved with the method 200 shown in FIG. 2 according to another embodiment of the present invention. The control unit 512 can be taken as an example of the control unit mentioned in the embodiment shown in FIG. 1. For example, the control unit 512 can be implemented by altering the detection and control circuit 112 shown in FIG. 1. In response to the change in architecture, the memory controller mentioned above is labeled with the new numeral 510, and the apparatus mentioned above is labeled with the new numeral 100-3. In addition, the memory 120 of this embodiment may be coupled to at least one external terminal module (e.g. one or more external terminal modules) positioned outside the memory 120, such as the external terminal module REXT shown in FIG. 10. For example, the external terminal module REXT can be an external impedance component such as a resistor positioned outside the memory 120.

As shown in FIG. 10, the memory controller 510 comprises the control unit 512 mentioned above, and further comprises the aforementioned comparator 116 (labeled "CMP" in FIG. 10, for brevity), the aforementioned first impedance component set PU[N:1], and the aforementioned second impedance component set PD[M:1] that are described in the embodiment shown in FIG. 1. In addition, the control unit 512 may use the comparator 116 to compare the signal mentioned in Step 210 with the reference voltage VREF. For example, the reference voltage VREF can be a reference voltage whose magnitude is equivalent to a fixed value, rather than being adjustable. This is for illustrative purposes only, and is not meant to be a limitation of the present invention. In another example, the reference voltage VREF can be adjustable. According to this embodiment, the aforementioned control unit such as the control circuit 412 may generate the aforementioned at least one detection result according to the aforementioned at least one comparison result, rather than simply using the aforementioned at least one comparison result as the aforementioned at least one detection result. Additionally, the command terminal COM1 is taken as an example of the digital terminal. Please note that, as long as the implementation will not be hindered, the related descriptions of the method 200 in any of the above embodiments, such as those described with the data terminal DAT1 being taken as an example of the digital terminal, can be applied to the architecture shown in FIG. 10, where the data terminal DAT1 replaces the command terminal COM1. Similar descriptions for this embodiment are not repeated in detail here.

Please note that the architecture of the embodiment shown in FIG. 10 can be described to operate by utilizing the plurality of impedance components, which may comprise the plurality of impedance component sets mentioned above. This is for illustrative purposes only, and is not meant to be a limitation of the present invention. According to some variations of this embodiment, the plurality of impedance components can be replaced by the plurality of current sources mentioned above, respectively. In response to the change in the architecture for these variations, the notation "Z" of each of the impedance components shown in FIG. 10 can be replaced by another notation such as "$I_s$", for example. For brevity, similar descriptions for these variations are not repeated in detail here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing memory interface calibration in an electronic device, the method being applied to a memory controller of the electronic device, the method comprising the steps of:
controlling a signal on a digital terminal of the memory controller to switch between a plurality of levels, wherein the digital terminal is coupled to a memory of the electronic device;
detecting a characteristic of the signal, on the digital terminal, received from the memory, wherein the characteristic comprises one or more of the amplitude, common mode level, or duty cycle of the second signal; and
by detecting the characteristic of the signal, calibrating a logical state of the signal to correspond to a level of the plurality of levels,
wherein the step of controlling the signal on the digital terminal of the memory controller to switch between the plurality of levels further comprises:
switching between a plurality of configurations of the memory controller to control the signal;
changing at least one control signal corresponding to at least one impedance component in a first impedance component set of a plurality of impedance components within the electronic device to switch between the plurality of configurations of the memory controller;
changing at least one control signal corresponding to at least one impedance component in a second impedance component set of the plurality of impedance components to switch between the plurality of configurations of the memory controller;
using a control signal corresponding to a first impedance component of the first impedance component set to selectively enable a conduction path between the digital terminal and a first node of the memory controller, wherein the conduction path between the digital terminal and the first node passes through the first impedance component of the first impedance component set; and
using a control signal corresponding to a second impedance component of the second impedance component set to selectively enable a conduction path between the digital terminal and a second node of the memory controller, wherein the conduction path between the digital terminal and the second node passes through the second impedance component of the second impedance component set.

2. The method of claim 1, wherein the step of controlling the signal on the digital terminal of the memory controller to switch between the plurality of levels further comprises:
using a control signal corresponding to a third impedance component of the first impedance component set to selectively enable a conduction path between the digital terminal and the first node of the memory controller, wherein the conduction path between the digital terminal and the first node passes through the third impedance component of the first impedance component set.

3. The method of claim 1, wherein the step of controlling the signal on the digital terminal of the memory controller to switch between the plurality of levels further comprises:
changing at least one control signal corresponding to at least one current source in a current source set of a plurality of current sources within the electronic device to switch between the plurality of configurations of the memory controller.

4. The method of claim 3, wherein the step of controlling the signal on the digital terminal of the memory controller to switch between the plurality of levels further comprises:
using a control signal corresponding to a current source of the current source set to selectively enable a conduction path between the digital terminal and the first node of the memory controller, wherein the conduction path between the digital terminal and the first node passes through the current source of the current source set.

5. The method of claim 3, wherein the step of controlling the signal on the digital terminal of the memory controller to switch between the plurality of levels further comprises:
changing at least one control signal corresponding to at least one current source in another current source set of the plurality of current sources to switch between the plurality of configurations of the memory controller.

6. The method of claim 5, wherein the step of controlling the signal on the digital terminal of the memory controller to switch between the plurality of levels further comprises:
using a control signal corresponding to a current source of the current source set to selectively enable a conduction path between the digital terminal and the first node of the memory controller, wherein the conduction path between the digital terminal and the first node passes through the current source of the current source set; and
using a control signal corresponding to a current source of the other current source set to selectively enable a conduction path between the digital terminal and the second node of the memory controller, wherein the conduction path between the digital terminal and the second node passes through the current source of the other current source set.

7. The method of claim 1, wherein the step of calibrating the logical state of the signal to correspond to the level of the plurality of levels further comprises:
based on at least one detection result obtained from detecting the signal, calibrating the logical state of the signal to correspond to the level of the plurality of levels and calibrating another logical state of the signal to correspond to another level of the plurality of levels.

8. The method of claim 1, wherein the digital terminal is a data terminal of the memory controller; and the method further comprises:

sending at least one command through a command terminal of the memory controller to the memory to cause the signal to be output from the memory;
wherein switching the signal from one of the plurality of levels to another of the plurality of levels is controlled by the memory controller.

9. The method of claim 8, wherein the step of sending the at least one command to the memory to cause the signal to be output from the memory further comprises:
using the at least one command to instruct the memory to control the signal to have a data pattern that alternatively switches between a logical value 0 and a logical value 1.

10. The method of claim 8, wherein the step of sending the at least one command to the memory to cause the signal to be output from the memory further comprises:
using the at least one command to instruct the memory to control the signal to have a data pattern of a single logical value, rather than a data pattern that alternatively switches between different logical values.

11. The method of claim 1, wherein the step of calibrating the logical state of the signal to correspond to the level of the plurality of levels further comprises:
based on at least one detection result obtained from detecting the signal, calibrating the logical state of the signal to correspond to the level of the plurality of levels;
wherein the at least one detection result comprises a duty cycle detection result; and
in a situation where a condition regarding the duty cycle detection result is satisfied, the logical state of the signal is calibrated to correspond to the level of the plurality of levels.

12. The method of claim 11, wherein when the duty cycle detection result indicates that a duty cycle of the signal is equal to a predetermined percentage, the logical state of the signal is calibrated to correspond to the level of the plurality of levels.

13. The method of claim 11, wherein when the duty cycle detection result indicates that a duty cycle of the signal falls within a range of a predetermined interval comprising a predetermined percentage, the logical state of the signal is calibrated to correspond to the level of the plurality of levels.

14. The method of claim 1, wherein the step of calibrating the logical state of the signal to correspond to the level of the plurality of levels further comprises:
based on at least one detection result obtained from detecting the signal, calibrating the logical state of the signal to correspond to the level of the plurality of levels;
wherein the at least one detection result comprises a common mode level detection result.

15. The method of claim 14, wherein when the common mode level detection result indicates that the common mode level of the signal is equivalent to a predetermined level, the logical state of the signal is calibrated to correspond to the level of the plurality of levels.

16. The method of claim 1, wherein the memory controller comprises a plurality of command terminals, a plurality of data terminals, and at least one clock terminal, which are used for coupling the memory controller to the memory; and
the digital terminal is a terminal of the plurality of command terminals or a terminal of the plurality of data terminals.

17. The method of claim 1, further comprising: detecting a common mode level of the signal; and determining a slicing level according to the common mode level, wherein the slicing level is used for parsing the signal to determine at least one logical state of the signal.

18. A method for performing memory interface calibration in an electronic device, the method being applied to a memory controller of the electronic device, the method comprising the steps of:

controlling a signal on a digital terminal of the memory controller to switch between a plurality of levels, wherein the digital terminal is coupled to a memory of the electronic device;

detecting a characteristic of the signal, on the digital terminal, received from the memory, wherein the characteristic comprises one or more of the amplitude, common mode level, or duty cycle of the second signal; and by detecting the characteristic of the signal, calibrating a logical state of the signal to correspond to a level of the plurality of levels, wherein controlling the signal on the digital terminal of the memory controller to switch between the plurality of levels further comprises:

switching between a plurality of configurations of the memory controller;

changing at least one control signal corresponding to at least a first current source in a first current source set of a plurality of current sources within the electronic device to switch between the plurality of configurations of the memory controller;

changing at least one control signal corresponding to at least a second current source in a second current source set of the plurality of current sources to switch between the plurality of configurations of the memory controller;

using a control signal corresponding to the first current source of the first current source set to selectively enable a conduction path between the digital terminal and a first node of the memory controller, wherein the conduction path between the digital terminal and the first node passes through the first current source of the first current source set; and using a control signal corresponding to the second current source of the second current source set to selectively enable a conduction path between the digital terminal and a second node of the memory controller, wherein the conduction path between the digital terminal and the second node passes through the second current source of the second current source set.

19. The method of claim 18, wherein the step of controlling the signal on the digital terminal of the memory controller to switch between the plurality of levels further comprises:

changing at least one control signal corresponding to at least a first impedance component in a first impedance component set of a plurality of impedance components within the electronic device to switch between the plurality of configurations of the memory controller.

20. The method of claim 19, wherein the step of controlling the signal on the digital terminal of the memory controller to switch between the plurality of levels further comprises:

changing at least one control signal corresponding to at least a second impedance component in a second impedance component set of the plurality of impedance components to switch between the plurality of configurations of the memory controller.

* * * * *